United States Patent [19]

Smith

[11] Patent Number: 5,266,793
[45] Date of Patent: Nov. 30, 1993

[54] FAIL-SAFE PHOTOAMPLIFIER CIRCUIT WITH A SAFETY LIGHT CURTAIN SYSTEM

[75] Inventor: Patrick G. Smith, Shakopee, Minn.

[73] Assignee: Banner Engineering Corporation, Minneapolis, Minn.

[21] Appl. No.: 875,275

[22] Filed: Apr. 28, 1992

[51] Int. Cl.$^5$ .............................................. H01J 40/14
[52] U.S. Cl. ................................ 250/214 A; 250/221; 330/308
[58] Field of Search .............. 250/214 A, 222.1, 221, 250/208.4; 340/507, 516, 555, 556, 557; 330/308, 59, 298, 207 P

[56] References Cited

U.S. PATENT DOCUMENTS

| | | |
|---|---|---|
| 3,612,884 | 10/1971 | Linardos . |
| 3,867,628 | 2/1975 | Brown . |
| 3,970,846 | 7/1976 | Schofield, Jr. et al. ............ 250/221 |
| 5,077,467 | 12/1991 | Barron, Jr. et al. . |
| 5,089,788 | 2/1992 | Shiga ................................. 330/308 |

OTHER PUBLICATIONS

Motorola Linear/Interface Devices, pp. 2-278 through 2-282 (no date).

Primary Examiner—David C. Nelms
Assistant Examiner—Que T. Le
Attorney, Agent, or Firm—Merchant, Gould, Smith, Edell, Welter & Schmidt

[57] ABSTRACT

A modulated photoamplifier precludes false output signals and oscillations in the event of component failure. The photoamplifier converts modulated electromagnetic energy into voltage pulses. A phototransistor receives the modulated electromagnetic energy and generates corresponding current pulses. A differential amplifier with negative feedback receives the current pulses and produces the corresponding amplified voltage pulses. A capacitor within the feedback network produces optimum gain at the frequency of the modulated electromagnetic energy. A failure of any component within the photoamplifier removes its ability to generate voltage pulses. Therefore, the photoamplifier precludes false output signals and fails to a safe condition in response to the component failure.

21 Claims, 5 Drawing Sheets

FAIL-SAFE PHOTOAMPLIFIER CIRCUIT WITH A SAFETY LIGHT CURTAIN SYSTEM

FIELD OF THE INVENTION

The present invention relates to modulated photoamplifiers that will not produce false output/signals in the event of a failure of any component within the amplifier.

BACKGROUND OF THE INVENTION

Photoelectric sensors, including modulated photoelectric sensors, are being used more frequently in safety related applications. The primary example is in safety light curtains, sometimes referred to as machine guards. These safety light curtains comprise multiple beams of electromagnetic energy, typically infrared modulated light, which cross an access area to a dangerous machine such as a punch press. If an operator's hand or arm, for example, penetrates the curtain, the machine is instantly shut down to prevent injury.

These types of devices are known in the art. Regulatory agency standards exist for these devices, and the standards are continually being refined. One common theme in all safety standards is a determination of the effect (if any) of component failure. The requirement is that the circuit fail to a safe condition, regardless of which component or plurality of components fail, or in the mode in which they fail. This requirement becomes particularly constraining because if a component failure goes "unannounced," the failed component must be left in the faulty state, and the failure analysis proceeds with other components. The designer is thus saddled with a "who watches the watchman" requirement.

The term that is often used to describe this type of analysis is "FMEA" (Failure Mode Effects Analysis). In this type of testing, each component is alternately opened and shorted. The effect on the circuit output of opening and shorting circuit components is analyzed to ensure that in no case does the safety circuit fail to a dangerous condition.

The photodetector itself and its associated amplifier circuitry is a particularly vulnerable portion of a photoelectric circuit. Designing a safe circuit is made especially difficult because the signals received by the photodetector are very small, often resulting in a generated signal of less than one millivolt, and the modulation or "pulsing" frequency of the received signal is high, often many KHZ. Compounding the problem is the system's pulsing of a group of light emitting diodes (LEDs) in order to transmit the high frequency modulated "light" signals for the beams of the light curtain. The receivers are designed to be most sensitive to, and have the highest gain at, the pulsing frequency of the LEDs. Therefore, if the emitting circuit induces any noise on the power supply, the noise may be coupled to the receiver circuit amplifier, potentially causing the receiver circuit to enter a failure mode in which the noise falsely appears at the receiver amplifier output as a valid "light" signal. This failure mode is especially likely when the amplifier circuitry gain is very high.

Another problem occurs when component failure creates positive feedback, resulting in oscillations within the amplifier circuit. High gain amplifier circuits are prone to go into oscillation any time positive feedback occurs. The frequency of the faulty oscillation is generally high compared to the modulation frequency of the received light. A component or harmonic of the faulty oscillation is frequently at just the right frequency to "fool" the receiver into responding as if it has received a valid "light" signal from the emitter. Accordingly, when component failure results in high frequency noise in the amplifier, the circuitry coupled to the amplifier output may be "fooled" into operating as if the amplifier has received "light" pulses, when in fact is has not.

This is the most dangerous potential condition. In this condition, a person's hand or arm could be blocking a "light" beam, but the receiver operates as if it is receiving an unblocked "light" signal, which creates the very dangerous situation of allowing the machine to operate even though the person's arm or hand has penetrated the light curtain.

A need, therefore, exists in the art for a photoelectric receiving and amplifier circuit that will not oscillate nor create false pulsing outputs no matter what failure mode exists in any of its components.

SUMMARY OF THE INVENTION

The present photoamplifier fails to a safe condition in the event of component failure. The photoamplifier may be used with a safety light curtain system that controls a machine. The system is designed, with the appropriate connection to the machine, to deactivate the machine if a light beam is broken. This may occur, for example, when a machine operator's hand or arm blocks a beam. If a photoamplifier component fails, the photoamplifier fails to a safe or "dark" condition such that it operates as if it has not received a light beam. In response to the "dark" condition and with appropriate connection to the machine, the system will safely shut down the machine to prevent injury.

The photoamplifier achieves fail-safe operation by precluding false output signals in the event of component failure. A failure of any photoamplifier component removes the photoamplifier's ability to produce an amplified voltage pulse at its output, thus precluding any false signals or oscillations at the output.

The photoamplifier is a transresistance amplifier that converts current pulses into corresponding amplified voltage pulses. A phototransistor receives electromagnetic energy pulses, such as infrared light, and produces corresponding current pulses. A differential amplifier with negative feedback receives the current pulses and generates the corresponding amplified voltage pulses. A capacitor within the feedback network creates optimum gain of the differential amplifier around the pulsing frequency of the electromagnetic energy.

BRIEF DESCRIPTION OF THE DRAWINGS

In the drawings, where like numerals refer to like components throughout several views.

DETAILED DESCRIPTION OF THE PREFERRED EMBODIMENT

In the following detailed description of the preferred embodiment, reference is made to the accompanying drawings which form a part hereof and in which is shown by way of illustration a specific embodiment in which the invention may be practiced. This embodiment is described in sufficient detail to enable those skilled in the art to practice the invention, and it is to be understood that other embodiments may be utilized and that structural or logical changes may be made without departing from the scope of the present invention. The following detailed description is, therefore, not to be taken in a limiting sense, and the scope of the present invention is defined by the appended claims.

OVERVIEW

Figure 1:
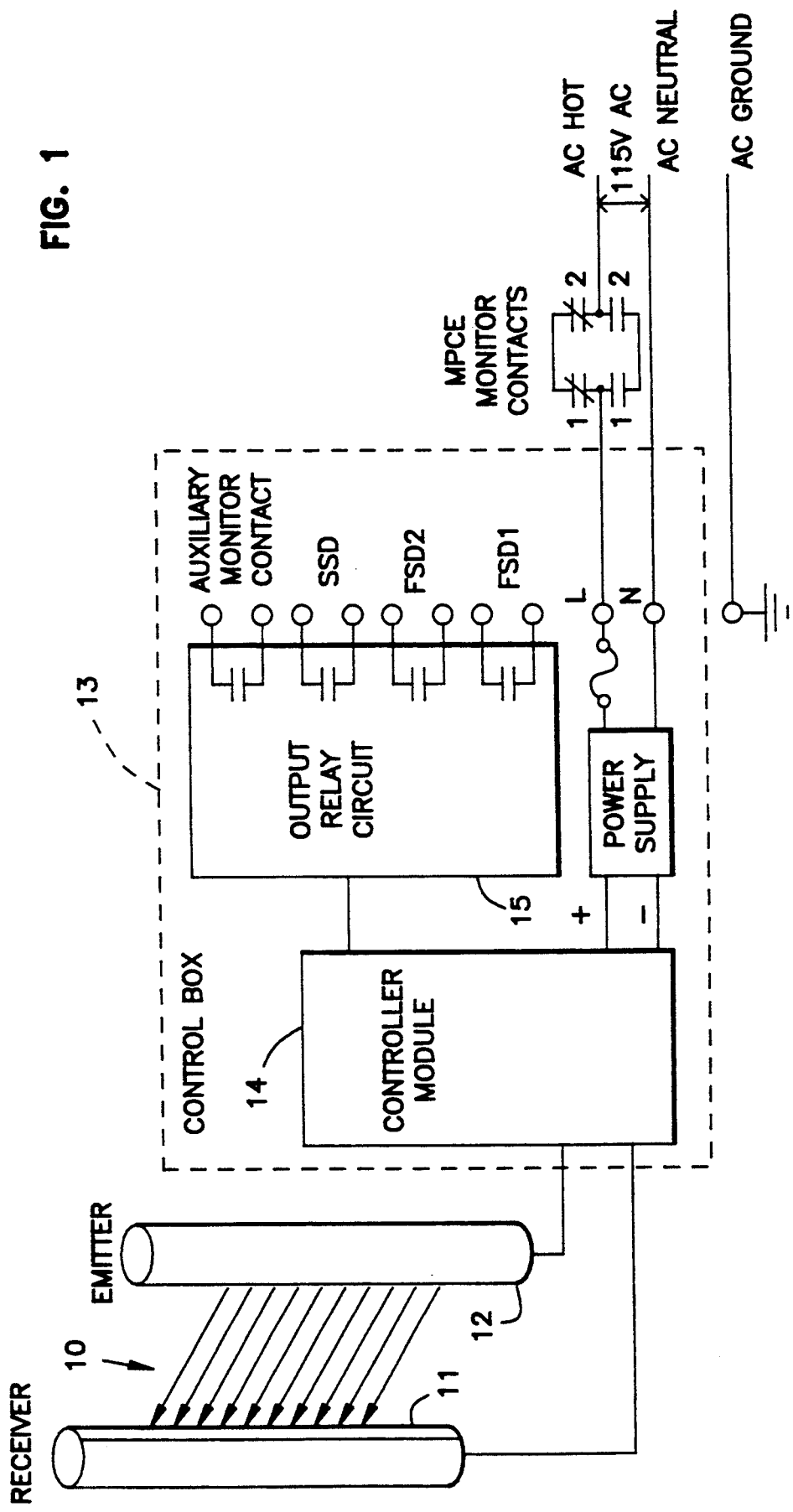
FIG. 1 is a block diagram of a "safety curtain" system for machinery and is an example of an application for the present photoamplifier circuit.

FIG. 1 shows an example of a system that uses the present photoamplifier. The system is intended to create a safety curtain of light for use with production machinery to prevent injury. One such system is the Banner BEAM-ARRAY MACHINE-GUARD system, developed and manufactured by Banner Engineering Corp., the assignee of the present invention.

Emitter 12 transmits modulated (pulsed) electromagnetic energy, which is typically infrared light. The infrared light signals create a curtain of light 10 and are detected by receiver 11. A control box 13 contains a controller module 14 that controls the emitter and processes signals received by the receiver. An output relay circuit 15 has relays FSD1, FSD2, and SSD which are connected to a machine (not shown) to be guarded. The FSD1 and FSD2 relays are connected to the Machine Primary Control Elements (MPCEs) of the machine to directly control the machine's normal operating motion. The SSD relay is connected to the Machine Secondary Control Element (MSCE) to remove power from the machine's dangerous prime mover.

In operation, the emitter and receiver would be positioned so that the curtain of light separates a machine operator from the dangerous moving parts of a machine. The machine operator, however, may need access to the machine. For example, the operator may need to position parts to be stamped within a hydraulic stamping press. The presence of the operator's hands and arms near or within the stamping press creates a very dangerous situation. The operator could be seriously injured if the press were accidentally engaged while the operator positioned parts.

The curtain of light prevents machine operation when an operator accesses the machine and thus "breaks" the curtain. When an operator's hand, for example, is present in the curtain of light 10, and thus blocking at least one of the infrared beams, the control module senses that a signal has not been received by at least one of the receiver elements in the receiver array 11. In response, the system opens the relays to disengage and remove power from the machine. Therefore, the system prevents injury to a machine operator by preventing operation of the machine when the operator has penetrated the curtain of light.

Figure 2:
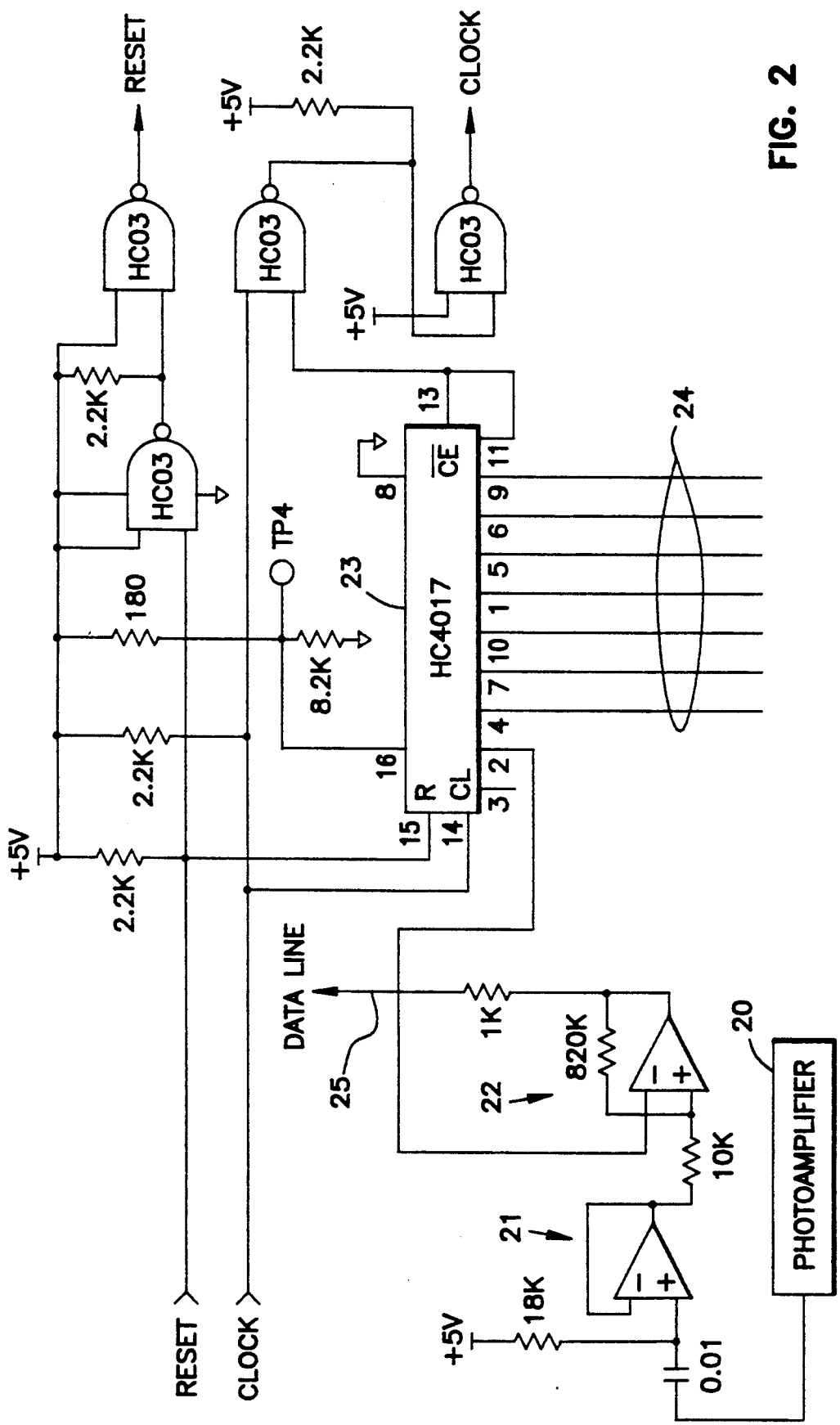
FIG. 2 is a block diagram of a receiver array for the "safety curtain" system.

FIG. 2 is a schematic diagram that shows the receiver array. The array shown is for a curtain of light containing eight infrared beams. Therefore, the array contains eight individual receivers. Only one receiver is shown; the other receivers have an identical circuit structure. Each receiver comprises a photoamplifier 20 coupled through a buffer 21 to a comparator 22. The photoamplifier detects an infrared light beam, converts it into a corresponding electrical signal, and provides amplification to the signal. Buffer 21 is a well known unitary gain op-amp configuration. Comparator 22 compares the signal from the photoamplifier with a signal from counter 23. The output of the comparator is coupled to a data line 25 and, after additional signal conditioning, is transmitted to a microprocessor (not shown) for processing.

Counter 23 contains eight output lines, one for each receiver. One line is shown connected to comparator 23. The other seven lines 24 would be connected one each to comparators for the other seven receivers. The system uses the counter to sequentially obtain the signals from each of the receivers. If any of the infrared beams are "broken," the absence of a received signal will be transmitted to the microprocessor via data line 25. The microprocessor, in response, will open the relays to deactivate the machine.

The reliability of the system is critically important, since the system is designed to prevent injury to a machine operator. The system must account for potential failure of system components. For example, the Banner BEAM-ARRAY MACHINE-GUARD system uses two microprocessors operating on different instruction sets to increase reliability with diverse redundancy.

The design of the photoamplifier is also of extreme importance in the reliability of the system. The photoamplifier is responsible for receiving the infrared light beams and generating a corresponding signal. The photoamplifier must not generate false signals in the event of component failure. A false signal means the situation where, even though a receiver amplifier does not detect an infrared beam, i.e. a beam is "broken," the receiver amplifier nonetheless transmits an output pulse, falsely indicating that it has received a "light" signal. A false signal may result, for example, if the failure of a component produces oscillations in the amplifier; the amplified oscillations will result in an output signal regardless of whether or not light is received.

The presence of false signals creates a very dangerous situation. If the system receives a false signal, then the machine will not be deactivated, even though something is penetrating the safety curtain. Therefore, in the event of component failure, the photoamplifier must not transmit an amplified pulse to ensure that the system, with appropriate connection to the machine, will safely shut down the machine to prevent injury.

PHOTOAMPLIFIER CIRCUIT OPERATION

Figure 3:
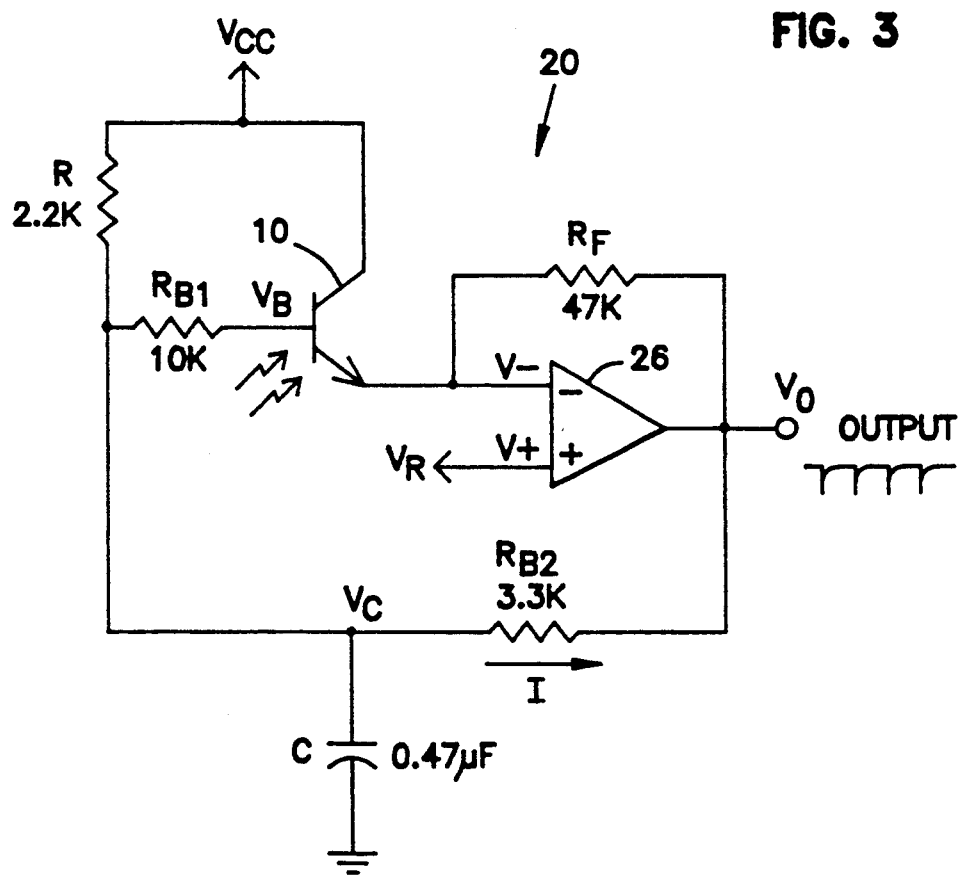
FIG. 3 is a schematic diagram of the photoamplifier circuit.

FIG. 3 is a schematic diagram of the photoamplifier. The circuit is transresistance amplifier. Phototransistor 10 detects the infrared light pulses transmitter by a corresponding emitter. The phototransistor 10 produces current pulses in response to the infrared light pulses. A phototransistor is used because it buffers the received light pulses. A photodiode with a transistor could be used in place of the phototransistor. Resistors R, $R_{B1}$, and $R_{B2}$ bias phototransistor 10.

Op-amp 26 converts the current pulses into corresponding amplified voltage pulses at the $V_0$ terminal. It is well known in the art that an op-amp operates as a differential amplifier. The op-amp 26 is preferably implemented with an MC34072 op-amp manufactured by Motorola.

Resistor $R_{B1}$, resistor $R_{B2}$, and capacitor C comprise a feedback network for the op-amp to provide high gain at the high pulsing frequency of the received infrared light. The photoamplifier uses resistors $R_{B1}$ and $R_{B2}$ both for biasing and to decrease the gain at low frequencies to reject ambient light signals. The capacitor C effectively breaks the feedback loop at high frequency to provide increased gain with increased received signal frequency. At the frequency of the modulated infrared light signals, the capacitor causes the photoamplifier to have increased gain to amplify the received light pulses. Feedback resistor $R_F$ is connected to the inverting input of the op-amp to provide a pole in the closed loop gain for stability.

The following is a circuit analysis of the DC open loop gain and high frequency operation of the photoamplifier 20. In the preferred embodiment, the supply voltage $V_{CC}$ is equal to +12 VDC, and the reference voltage $V_R$ is equal to +8 VDC.

DC Analysis

Assume that $\beta = \infty$, so that $I_B = 0$, and $V_+ = V_-$. In operation, the base-emitter junction of phototransistor 10 is forward biased, so that $V_B = V_- + 0.6$ V. Since $I_B = 0$, there is no voltage drop across $R_{B1}$; therefore, $V_B = V_C = V_- + 0.6$ V $= V_R + 0.6$ V.

To determine the DC output voltage $V_O$, a node equation can be written at node $V_C$ as shown in equation [1]. Equation [1] may be expressed as shown in equation [2], which may be solved for $V_O$ as shown in equation [3].

$$\frac{V_{CC} - V_C}{R} = I = \frac{V_C - V_O}{R_{B2}} \quad [1]$$

$$(V_{CC} - V_C)R_{B2} = (V_C - V_O)R \quad [2]$$

$$V_O = \frac{(V_R + 0.6 \text{ V})(R + R_{B2}) - V_{CC} R_{B2}}{R} \quad [3]$$

High Frequency Analysis

Figure 4:
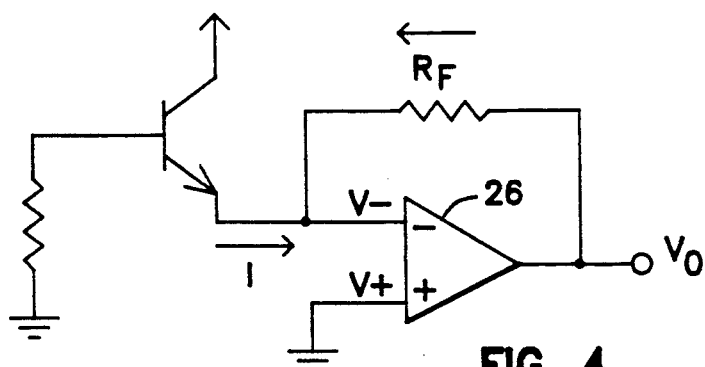
FIG. 4 is a model of the photoamplifier circuit for determining the open loop DC gain.
Figure 5:
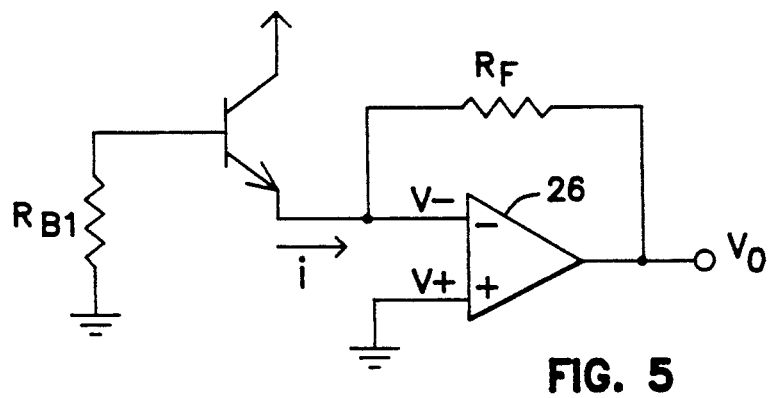
FIG. 5 is a model of the photoamplifier circuit for determining the input impedance of an op-amp in the circuit.

The high frequency gain shows the actual operating region of the amplifier, since the received light is modulated. First, the open loop gain of the photoamplifier may be calculated. FIG. 4 is a model of the photoamplifier for determining open loop gain. The open loop gain is calculated by solving two equations for $V_-$. First, a node equation [4] may be written for node $V_-$ and expressed as shown in equation [5].

$$\frac{V_- - V_O}{R_F} = I \quad [4]$$

$$V_- - V_O = R_F I \quad [5]$$

Another equation [6] may be written for the well known differential gain of an op-amp. Equation [6] may be solved for $V_-$ and expressed as shown in equation [7].

$$(V_+ - V_-)A_{VOL} = V_O \quad [6]$$

$$V_- = \frac{V_+ A_{VOL} - V_O}{A_{VOL}} \quad [7]$$

Equation [8] is obtained by substituting equation [7] for $V_-$ in equation [5].

$$\frac{V_+ A_{VOL} - V_O}{A_{VOL}} - V_O = R_F I \quad [8]$$

Finally, equation [8] may be solved for $V_O$ to obtain the open loop gain, as shown in equation [9].

$$V_O = -\frac{A_{VOL} R_F I}{1 + A_{VOL}} \quad [9]$$

The high frequency closed loop gain will now be calculated. The first step in determining the high frequency gain is to calculate the impedance $Z_{in}$ looking into the inverting input of op-amp 26. FIG. 4 is a model of the photoamplifier for calculating $Z_{in}$.

Substituting equation [9] for $V_O$ in the standard equation for the differential gain of an op-amp (equation [6] results in equation [10].

$$(V_+ + V_-)A_{VOL} = \frac{A_{VOL} R_F I}{1 + A_{VOL}} \quad [10]$$

Equation [10] may be solved for the ratio $V_-/I$, which is equal to $Z_{in}$ and is shown in equation [11].

$$Z_{in} = \frac{R_F}{1 + A_{VOL}} \quad [11]$$

Figure 6:
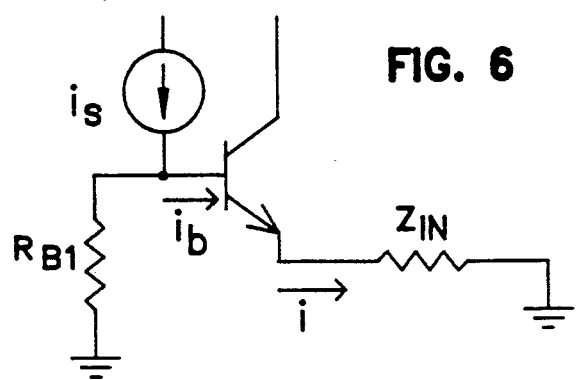
FIG. 6 is a model of the photoamplifier circuit for determining the high frequency gain.

The next step in calculating the high frequency closed loop gain involves using the small signal model of the photoamplifier as shown in FIG. 6. Assume that a variable frequency current source $i_s$ drives the base of the phototransistor to produce current pulses analogous to those produced from infrared light pulses.

Equations [12] and [13] are used to express currents $i_b$ and $i$ respectively.

$$i_b = \frac{R_{B1} i_s}{R_{B1} + Z_{in} h_{fe}} \quad [12]$$

$$i = \frac{h_{fe} i_s R_{B1}}{R_{B1} + Z_{in} h_{fe}} \quad [13]$$

Equation [14] is used to express the output voltage $V_O$, using equations [11] and [13] to substitute for $Z_{in}$ and $i$ respectively.

$$V_O = A_{VOL} Z_{in} i = \frac{R_F h_{fe} i_s R_{B1} A_{VOL}}{(1 + A_{VOL})(R_{B1} + Z_{in} h_{fe})} \quad [14]$$

Solving equation [14] for the ratio $V_O/i_s$ provides small closed loop gain, as shown in equation [15].

$$\frac{V_O}{i_s} = \frac{A_{VOL} h_{fe} R_F R_{B1}}{(1 + A_{VOL})R_{B1} + R_F h_{fe}} \quad [15]$$

At high frequency one can assume that $h_{fe} > A_{VOL}$. Using this assumption, equation [15] may be modified to express the high frequency closed loop gain as shown in equation [16].

$$\frac{V_O}{I_s} \approx A_{VOL} R_{B1} \quad [16]$$

Figure 7:
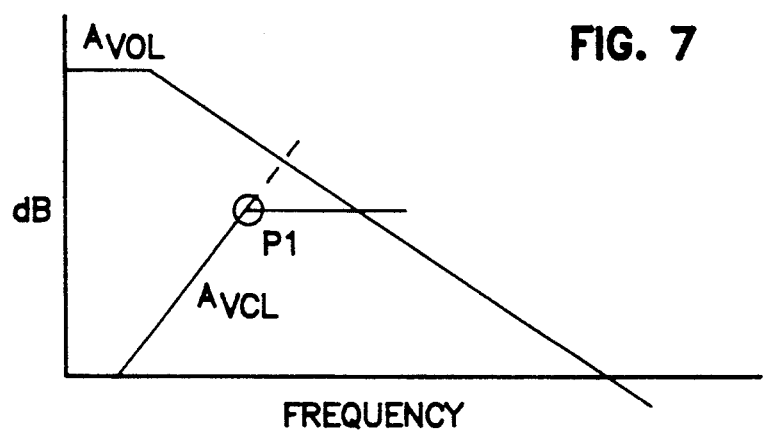
FIG. 7 is graph illustrating the frequency response of the photoamplifier circuit.

FIG. 7 illustrates the frequency response of the photoamplifier. In the frequency response: $A_{VOL}$ represents the open loop gain; $A_{VCL}$ represents the closed loop gain; and P1 represents a pole in the closed loop gain caused by resistor $R_F$. At low frequencies, the photoamplifier has a very small gain, which allows it to reject ambient light signals. The gain increases as frequency increases to allow sufficient gain around the frequency of the infrared light pulses. Furthermore, resistor $R_F$ ensures stability by dominating the high frequency closed loop gain.

FAILURE MODE EFFECTS ANALYSIS

The photoamplifier may operate in two different modes, active mode and failure mode. In the active mode, all photoamplifier components are functioning properly; the photoamplifier detects modulated infrared light signals and converts the detected signals into corresponding amplified voltage pulses. If the photoamplifier does not detect the infrared light signals because, for example, a hand is blocking a light beam, then it will not transmit voltage pulses. The system will detect this absence of voltage pulses as a "dark" condition and, in response, will safely shut down the machine, provided that the system is appropriately connected to the machine. The "dark" condition means that the photoamplifier operates as if it has received no light.

The failure mode ensures that, with appropriate connection to the machine, the system will shut down the machine in the event of component failure in the photoamplifier. As explained below, if any component in the photoamplifier fails, the photoamplifier is precluded from transmitting output voltage pulses, which the system interprets as a "dark" condition in order to safely shut down the machine, provided that the system is appropriately connected to the machine. Component failure means that a component is neither shorted or opened.

Table 1 is an actual FMEA, which shows the effect on the output signal $V_0$ of shorting and opening each circuit element of the photoamplifier 20 in FIG. 3. In each case, the result is the inability of the op-amp 26 to pass an amplified pulse on to the comparator. The control circuitry coupled to the photoamplifier interprets this lack of pulse as a "dark" condition. In response to the "dark" condition, the control circuitry, with appropriate connection to the machine, safely shuts down the machinery.

TABLE 1

| PHOTOAMPLIFIER FMEA | |
|---|---|
| Component Failure | Resulting Circuit Operation |
| R Open: | The photoamplifier will bias itself through $R_F$, leaving phototransistor 10 reverse-biased and unable to response to light pulses. |
| R Shorted: | The op-amp output will saturate at the negative op-amp supply voltage ("negative rail"), trying unsuccessfully to bring the inverting input down to 8 volts. |
| $R_F$ Open: | The op-amp output will saturate at the negative rail, because this type of op-amp sources input current, and without $R_F$ in the circuit the inverting input goes higher than the 8 volt non-inverting input. |
| $R_F$ Shorted: | All the gain is removed from the photoamplifier, resulting in a "dark" condition no matter what the actual condition. |
| $R_{B1}$ Open: | The op-amp will bias itself through $R_F$, leaving phototransistor 10 reverse biased and unable to produce a "light" signal. |
| $R_{B1}$ Shorted: | Any base current developed in phototransistor 10 as a result of light pulses will be shunted to ground through C, resulting in a "dark" condition no matter what the actual condition. |
| $R_{B2}$ Open: | The op-amp will saturate at the negative rail, attempting to bring the inverting input down to 8 volts. |
| $R_{B2}$ Shorted: | Any pulse that the op-amp tries to transmit to the comparator will be shunted to ground through C, because the output impedance of the op-amp is high compared to the impedance of C. |
| C Open: | High frequency gain is eliminated, resulting in a "dark" condition. |
| C Shorted: | The op-amp will saturate at the positive op-amp supply voltage ("positive rail"), resulting in a "dark" condition. |
| Phototransistor 10 Base Open: | Same effect as $R_{B1}$ open. |
| Phototransistor Collector 10 Open: | Phototransistor 10 will not generate an input signal to the op-amp, resulting in a permanent "dark" condition. |
| Phototransistor 10 Emitter Open: | Same as phototransistor 10 collector open. |
| Phototransistor 10 Collector-Base Short: | The op-amp will saturate at the negative rail, trying to bring the inverting input down to 8 volts. |
| Phototransistor 10 Base-Emitter Short: | Phototransistor 10 will act like a photodiode, with no phototransistor gain, resulting in such a small op-amp output that it will be seen as a "dark" condition. |
| Phototransistor 10 Collector-Emitter Short: | The op-amp will saturate at the negative rail, trying to bring the inverting input down to 8 volts. |
| Op-amp Non-inverting Input Open: | The op-amp will saturate at the positive rail, since the non-inverting input current has no escape path, maintaining the non-inverting input higher than the inverting input. |
| Op-amp Inverting Input Open: | The op-amp will saturate at the negative rail, since the inverting input current has no escape path, |

TABLE 1-continued

PHOTOAMPLIFIER FMEA

| Component Failure | Resulting Circuit Operation |
|---|---|
| | maintaining the inverting input higher than the non-inverting input. |
| Op-amp Inputs Shorted Together: | The amplifier gain is lost, resulting in a "dark" condition. |

While the present invention has been describe connection with the preferred embodiment thereof, it will be understood that many modifications will be readily apparent to those skilled in the art, and this application is intended to cover any adaptations or variations thereof. For example, components with different values, or a different type of op-amp or differential amplifier, may be used without departing from the scope of the invention. Likewise, the photoamplifier is shown as receiving modulated infrared light; however, the photoamplifier would also function with electromagnetic energy from a different portion of the spectrum.

A safety light curtain is shown as an example of a device that incorporates the photoamplifier circuit. However, the photoamplifier is not intended to be limited to safety light curtains. The photoamplifier may be used in any environment or device where it is desired that the photoamplifier fail to a safe or "dark" condition in the event of component failure.

It is manifestly intended that this invention be limited only by the claims and equivalents thereof.

What is claimed is:

1. A fail-safe photoamplifier having a signal gain for generating amplified signals, comprising:
    receiver means for receiving an electromagnetic signal and for generating a corresponding amplified electrical signal, any failure of any component said receiver means resulting in an effective loss of said signal gain;
    biasing means for biasing said receiver means, any failure of any component said biasing means resulting in an effective loss of said signal gain;
    a differential amplifier having a first input terminal coupled to said receiver means, a second input terminal coupled to receive a reference voltage, and an output terminal, any failure of any component said differential amplifier resulting in an effective loss of said signal gain; and
    feedback means for providing negative feedback to said differential amplifier, any failure of any component said feedback means resulting in an effective loss of said signal gain.

2. The photoamplifier of claim 1 wherein:
    said biasing means comprises:
        a first resistor coupled between said receiver means and a node;
        a second resistor coupled between said node and to receive a supply voltage; and
        a third resistor coupled between said node and said output terminal; and said feedback means comprises:
        said first resistor;
        said third resistor;
        a fourth resistor couple between said output terminal and said first input terminal; and
        a capacitor coupled between said node and a ground terminal.

3. The photoamplifier of claim 1 wherein said receiver means comprises a phototransistor having a base coupled to said biasing means, a collector coupled to receive a supply voltage, and an emitter coupled to said first input terminal.

4. The photoamplifier of claim 1 wherein said biasing means comprises:
    a first resistor coupled between said receiver means and a node;
    a second resistor coupled between said node and to receive a supply voltage; and
    a third resistor coupled between said node and said output terminal.

5. The photoamplifier of claim 1 wherein said differential amplifier comprises an op-amp.

6. The photoamplifier of claim 5 wherein:
    said op-amp functions by sourcing current at said first and second input terminals; and
    a failure of said feedback means resulting from a removal of said negative feedback results in an effective loss of said signal gain by removing an escape path for said sourced current of said op-amp.

7. The photoamplifier of claim 1 wherein said feedback means comprises:
    a first resistor coupled between said output terminal and said first input terminal;
    a second resistor coupled between said output terminal and a node;
    a third resistor coupled between said receiver means and said node; and
    a capacitor coupled between said node and a ground terminal.

8. The photoamplifier of claim 1 wherein said receiver means comprises means for receiving infrared light and for generating a corresponding current signal.

9. A fail-safe modulated photoamplifier for operation in an environment with a machine control system having a safety light curtain produced by emitter and receiver arrays, said photoamplifier operating to receive a pulsed electromagnetic signal from said emitter array and to generate corresponding output voltage pulses to indicate that said photoamplifier has received said pulsed electromagnetic signal, said photoamplifier further operating to generate a steady-state output signal to indicate either that said photoamplifier has not received said pulsed electromagnetic signal or that a component within said photoamplifier has failed, such that said machine control system, with appropriate connection to a machine, will safely shut down said machine in response to said steady-state signal, said photoamplifier comprising:
    receiver means for receiving said pulsed electromagnetic signal and for generating a corresponding electrical signal, said photoamplifier operative to generate said steady-state signal in response to any failure of any component said receiver means;
    biasing means for biasing said receiver means, said photoamplifier operative to generate said steady-state signal in response to any failure of any component said biasing means;
    a differential amplifier having a first input terminal coupled to said receiver means, a second input terminal coupled to receive a reference voltage, and an output terminal, said photoamplifier operative to generate said steady-state signal in response to any failure of any component said differential amplifier; and feedback means for providing high gain at a frequency of said pulsed electromagnetic signal, said photoamplifier operative to generate said steady-state signal in response to any failure of any component said failure means.

10. The photoamplifier of claim 9 wherein:
said biasing means comprises:
   a first resistor coupled between said receiver means and a node;
   a second resistor coupled between said node and to receive a supply voltage; and
   a third resistor coupled between said node and said output terminal; and said feedback means comprises:
   said first resistor;
   said third resistor;
   a fourth resistor coupled between said output terminal and said first input terminal; and
   a capacitor coupled between said node and a ground terminal.

11. The photoamplifier of claim 9 wherein said receiver means comprises a phototransistor having a base coupled to said biasing means, a collector coupled to receive a supply voltage, and an emitter coupled to said first input terminal.

12. The photoamplifier of claim 9 wherein said biasing means comprises:
   a first resistor coupled between said receiver means and a node;
   a second resistor coupled between said node and to receive a supply voltage; and
   a third resistor coupled between said node and said output terminal.

13. The photoamplifier of claim 9 wherein said differential amplifier comprises an op-amp.

14. The photoamplifier of claim 13 wherein:
said op-amp functions by sourcing current at said first and second input terminals; and
a failure of said feedback means resulting from a removal of said negative feedback results in said steady-state signal by removing an escape path for said sourced current of said op-amp.

15. The photoamplifier of claim 9 wherein said feedback means comprises:
   a first resistor coupled between said output terminal and said first input terminal;
   a second resistor coupled between said output terminal and a node;
   a third resistor coupled between said receiver means and said node; and
   a capacitor coupled between said node and a ground terminal.

16. The photoamplifier of claim 9 wherein said receiver means comprises means for receiving modulated infrared light and for generating a corresponding pulsed current signal.

17. A fail-safe photoamplifier, comprising:
   receiver means, coupled to receive a supply voltage, for receiving an electromagnetic signal and for generating a corresponding electrical signal;
   an op-amp having an inverting input terminal coupled to said receiver means, a non-inverting input terminal coupled to receive a reference voltage, and an output terminal;
   a first resistor coupled between a node and said receiver means;
   a second resistor coupled between said node and to receive said supply voltage;
   a third resistor coupled between said node and said output terminal;
   a fourth resistor coupled between said output terminal and said inverting input terminal; and
   a capacitor coupled between said node and a ground terminal.

18. The photoamplifier of claim 17 wherein said receiver means comprises a phototransistor having a base coupled to said first resistor, a collector coupled to receive said supply voltage, and an emitter coupled to said inverting input terminal.

19. The photoamplifier of claim 17 wherein said op-amp functions by sourcing current at said inverting and non-inverting input terminals.

20. A modulated photoamplifier, comprising:
   receiver means, coupled to receive a supply voltage, for receiving a pulsed electromagnetic signal and for generating a corresponding pulsed electrical signal;
   a differential amplifier having a first input terminal coupled to said receiver means, a second output terminal coupled to receive a reference voltage, and an output terminal;
   resistive means, coupled between said output terminal and said receiver means, for biasing said receiver means and for decreasing a closed loop gain of said photoamplifier amplifier at low frequencies to reject ambient light signals;
   capacitive means, coupled between said resistive means and a ground terminal, for increasing said closed loop gain to provide optimum gain at a frequency of said pulsed electromagnetic signal; and
   feedback means, coupled between said output terminal and said first input terminal, for providing a pole in said closed loop gain for stability.

21. A safety light current system with a fail-safe modulated photoamplifier, comprising:
   emitter means for transmitting a pulsed electromagnetic signal;
   a photoamplifier for receiving and amplifying said pulsed electromagnetic signal, said photoamplifier operating to generate corresponding output voltage pulses to indicate that said photoamplifier has received said pulsed electromagnetic signal and further operating to generate a steady-state output signal to indicate either that said photoamplifier has not received said pulsed electromagnetic signal or that any component within said photoamplifier has failed, said photoamplifier comprising:
      receiver means for receiving said pulsed electromagnetic signal and for generating said corresponding voltage pulses, said photoamplifier operative to generate said steady-state signal in response to any failure of any component and receiver means;
      biasing means for biasing said receiver means, said photoamplifier operative to generate said steady-state signal in response to any failure of any component said biasing means;
      a differential amplifier having a first input terminal coupled to said receiver means, a second input terminal coupled to receive a reference voltage, and an output terminal, said photoamplifier operative to generate said steady-state signal in response to any failure of any component said differential amplifier; and
      feedback means for providing high gain at a frequency of said pulsed electromagnetic signal, said photoamplifier operative to generate said steady-state signal in response to any failure of any component said feedback means; and processing means, coupled to said emitter means and said photoamplifier, for controlling power to a machine, comprising:

means for receiving said voltage pulses and said steady-state signal;

relay means for controlling connection of a power supply to said machine; and means for activating said relay means in order to engage said power supply to said machine in response to said voltage pulses and for activating said relay means in order to disengage said power supply from said machine in response to said steady-state signal, whereby said processing means safely shuts down said machine in response to said steady-state signal.

* * * * *

UNITED STATES PATENT AND TRADEMARK OFFICE
CERTIFICATE OF CORRECTION

PATENT NO. : 5,266,793

DATED : November 30, 1993

INVENTOR(S) : Patrick G. Smith

It is certified that error appears in the above-identified patent and that said Letters Patent is hereby corrected as shown below:

In column 7, line 42, "neither" should read --either--.

In column 9, lines 38, 42, 48 and 52, insert --of-- after the word "component".

In column 10, lines 56, 60 and 66, insert --of-- after the word "component".

In column 11, line 3, insert --of-- after the word "component".

In column 12, line 58, insert --of-- after the word "component".

In column 12, line 64, insert --of-- after the word "component".

In column 13, line 2, insert --of-- after the word "component".

In column 11, line 60, "anon-inverting" should read --a non-inverting--.

In column 12, line 19, "output" should read --input--.

In column 12, line 25, delete "amplifier" after the word "photoamplifier".

UNITED STATES PATENT AND TRADEMARK OFFICE
CERTIFICATE OF CORRECTION

PATENT NO. : 5,266,793

DATED : November 30, 1993

INVENTOR(S) : Patrick G. Smith

It is certified that error appears in the above-indentified patent and that said Letters Patent is hereby corrected as shown below:

In column 12, lines 53 and 54, "and" should read --of said--.

Signed and Sealed this

Fourteenth Day of June, 1994

Attest:

BRUCE LEHMAN

Attesting Officer

Commissioner of Patents and Trademarks